United States Patent [19]

Scavino

[11] Patent Number: 4,838,472

[45] Date of Patent: Jun. 13, 1989

[54] ORTHOGONAL AXIS DEVICE WITH LINEAR MOTORS FOR POSITIONING AND BONDING WIRES ONTO ELECTRONIC COMPONENTS

[76] Inventor: Mario Scavino, Via Alla Cava, 5-20050 Lesmo(Como), Italy

[21] Appl. No.: 169,413

[22] Filed: Mar. 17, 1988

[30] Foreign Application Priority Data

Mar. 30, 1987 [IT] Italy .................. 19899 A/87

[51] Int. Cl.⁴ .............................................. B23K 1/20
[52] U.S. Cl. ................................................... 228/4.5
[58] Field of Search ............... 228/4.5, 110, 7, 1.1, 228/4.1

[56] References Cited

U.S. PATENT DOCUMENTS

| | | | |
|---|---|---|---|
| 3,960,309 | 6/1976 | Hazel | 228/4.5 |
| 3,973,713 | 8/1976 | Furuya et al. | 228/4.5 |
| 4,437,603 | 3/1984 | Kobayashi et al. | 228/4.5 |
| 4,516,673 | 5/1985 | Kashihara et al. | 228/4.5 |
| 4,583,676 | 4/1986 | Pena | 228/4.5 |
| 4,610,387 | 9/1986 | Scavino | 228/1.1 |

FOREIGN PATENT DOCUMENTS 154535 8/1985 Japan .................. 228/4.5

Primary Examiner—M. Jordan
Attorney, Agent, or Firm—Ladas & Parry

[57] ABSTRACT

A device for positioning and processing workpieces, in particular for bonding wires onto electronic components, with movement along two orthogonal X-Y axes on which there lie two non-superposed components of the processing machine, the first component, positioned along an X-axis, comprising means for supporting and clamping a workpiece while operating thereon, whereas the second component, positioned along a Y-axis, carries an operating head. Said means for clamping and supporting the workpiece also form the workpiece feed mechanism and are rigid partly with the first component and partly with a mobile member forming part of said first component. Said mobile member carries a coil forming the armature of a linear motor, the stator of which, rigid with the external structure of said first component, comprises permanent magnets positioned to the side of the coil. Said mobile member is supported pneumatically by stationary pneumostatic shoes. A position sensor is also provided for controlling the moving parts, the sensor allowing bonding to be programmed for execution at different pitches on components of different dimensions, and at different points.

17 Claims, 3 Drawing Sheets

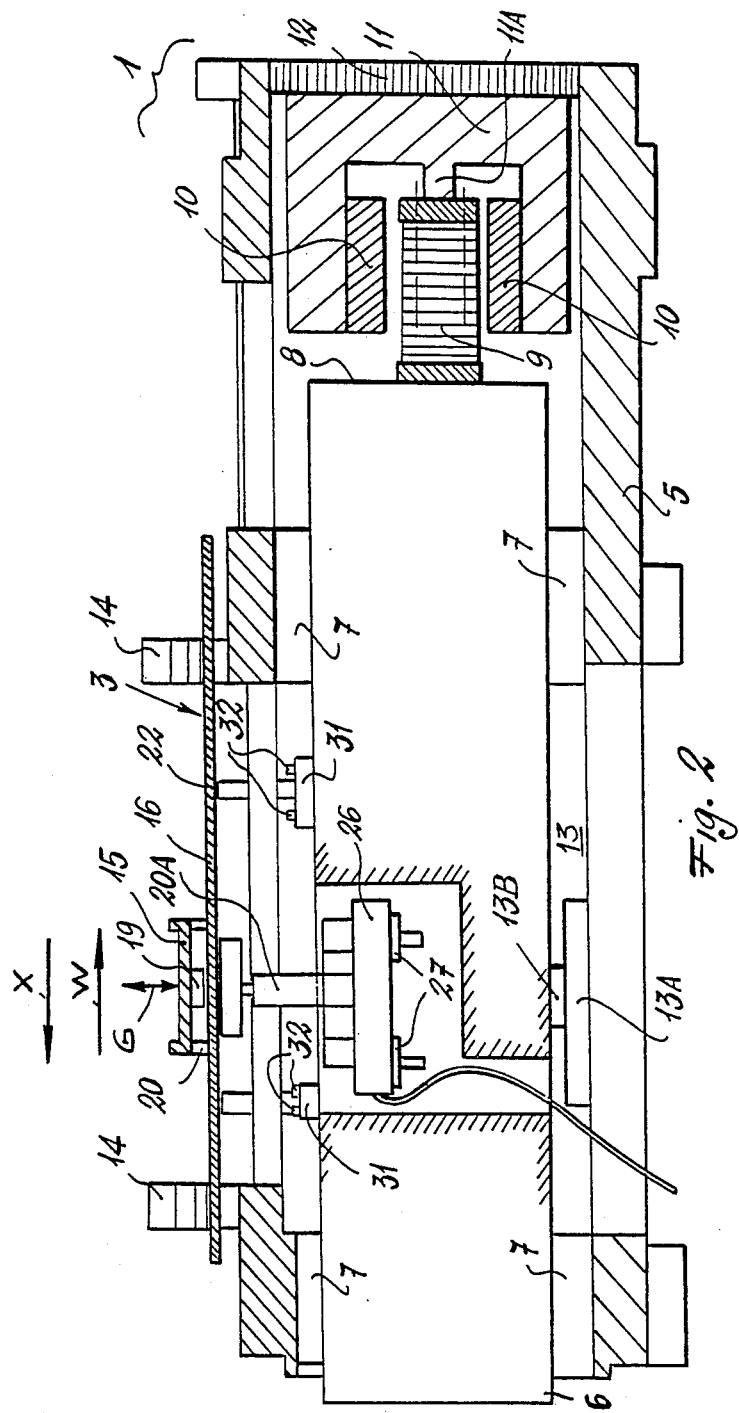

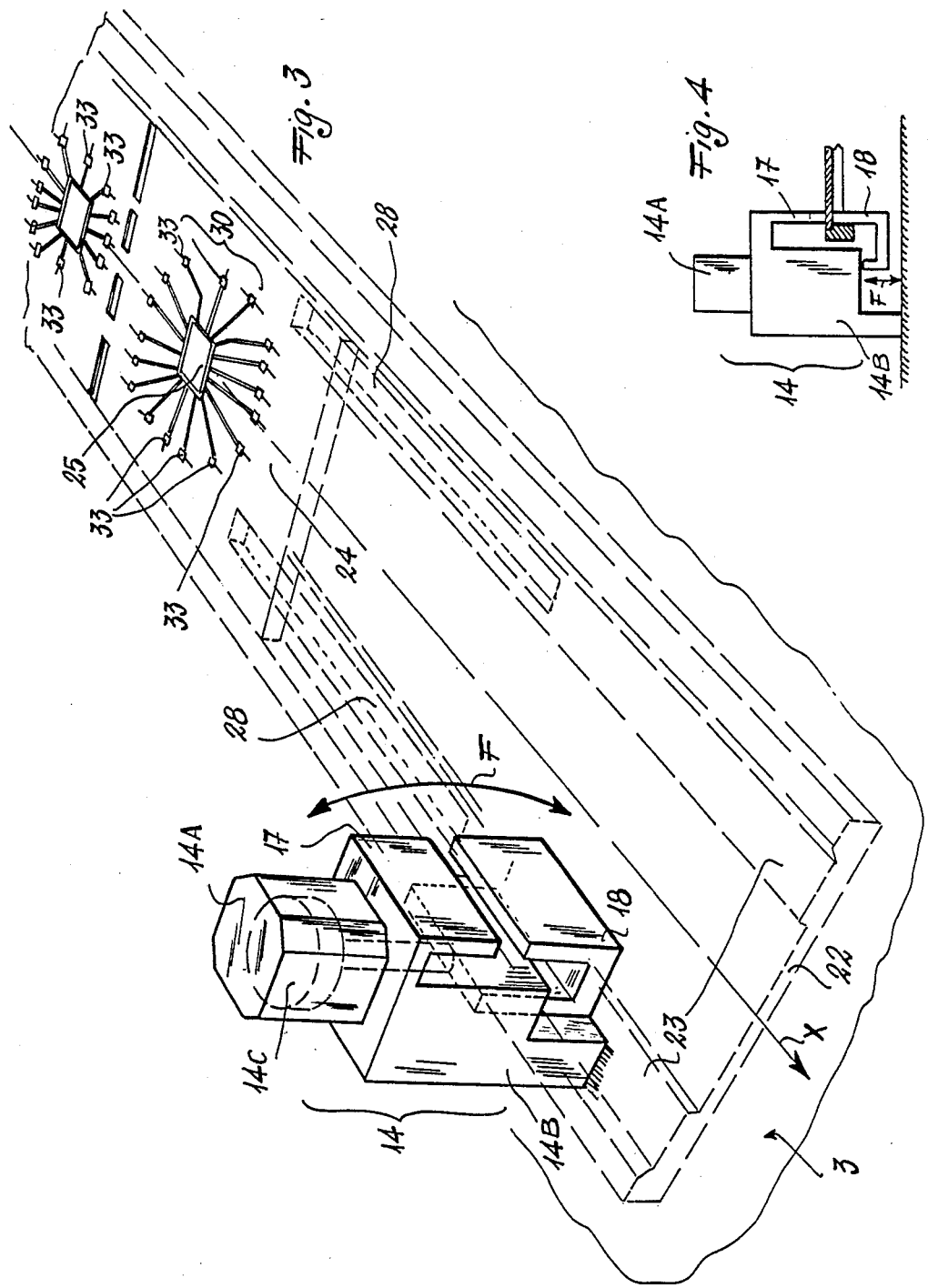

ORTHOGONAL AXIS DEVICE WITH LINEAR MOTORS FOR POSITIONING AND BONDING WIRES ONTO ELECTRONIC COMPONENTS

This invention relates to a device for positioning and processing workpieces, in particular for bonding wires onto electronic components.

BACKGROUND OF THE INVENTION

Devices are known for soldering thin conducting wires between a microcircuit (chip) and its terminals. Such a wire bonder is described in Italian patent application Nos. 23989 B/85 and 23844 B/83 and in U.S. Pat. No. 4,610,387, and generally comprises a table holding the workpiece, an ultrasonic operating head and a system for feeding the workpieces, which in particular are thin metal strips shaped by photoengraving or punching and which support the microcircuit (chip). The necessary connection wires are bonded between the microcircuits and the ends of said strips.

Commercially available machines are generally of two types, namely a first type with its work table able to move along two horizontal axes X-Y with its operating head in a fixed position, and a second type in which the work table remains stationary during the bonding that is done by a mobile operating head, i.e. one which moves along two orthogonal axes X-Y and is carried by two tables or similar members positioned one on the other and which one is mobile along the X-axis and the other along the Y-axis.

The second type is a development of the first which has a low bonding speed, but because of the way in which is is constructed this second type is also slow and not very accurate. In this respect, in both these processing machines both of the tables have to be moved when process displacements are required in either of the two directions. Due to considerable system inertia and, it is impossible to increase the working rate beyond a certain limit. However, the aspect which affects bonding accuracy the most is that fact that as the two tables are superposed, such that any inaccuracy in the movement of the first table influences the second.

A further important point is that current machines for feeding the strip at a variable pitch require a programmable mechanism devised for this purpose, and comprising a control system, a transmission and a motor.

An object of the present invention is to provide a device for positioning and processing workpieces, and in particular for bonding wires onto electronic components, which is of high operational speed and accuracy, lower constructional cost and shorter maintenance down-times, and which can be programmed to execute operations at differing pitch without external intervention, such as variable-pitch bonding on components of different dimensions.

These and further objects which will be more apparent to a person skilled in the art are attained by a device with movement along two orthogonal axes for positioning and processing workpieces, in particular for bonding wires onto electronic components, characterised in that on said axes, namely the X and Y axes, there are positioned two non-superposed components, the first of which, positioned on the X-axis, comprises means for supporting and clamping the workpiece, whereas the second components, positioned on the Y-axis, carries an operating head for processing purposes.

Said clamping and support means and said operating head are associated with mobile members of the first and second component. These mobile members are driven by linear motors so as to eliminate unwanted weight and working inaccuracy. Said mobile members are preferably bars of polygonal cross-section which are supported by shoes through which compressed air is delivered, i.e. pneumostatic shoes, so as to reduce friction between the surfaces and the ensure excellent rigidity and low inertia. Finally, said workpiece support and clamping elements are also used to drive the workpiece during processing, and it is possible using movement control and programming means to make the work table undergo any required movement pitch, so as to dispense with a normal motor which is an essential item of the feed mechanism of current machines.

A preferred embodiment of the device of the present invention applied to the bonding of wires onto electronic components is described hereinafter by way of example.

THE BRIEF DESCRIPTION OF DRAWINGS

The invention will be more apparent from the accompanying drawings in which:

FIG. 2 is a diagrammatic section on the line II-II of FIG. 1;

FIG. 3 is a detail of FIG. 1 showing a gripper used for feeding the workpieces to be processed;

FIG. 4 is a view in the direction of the arrow A of FIG. 3, with elements shown in section for greater clarity.

DETAILED DESCRIPTION OF THE INVENTION

Figure 1:
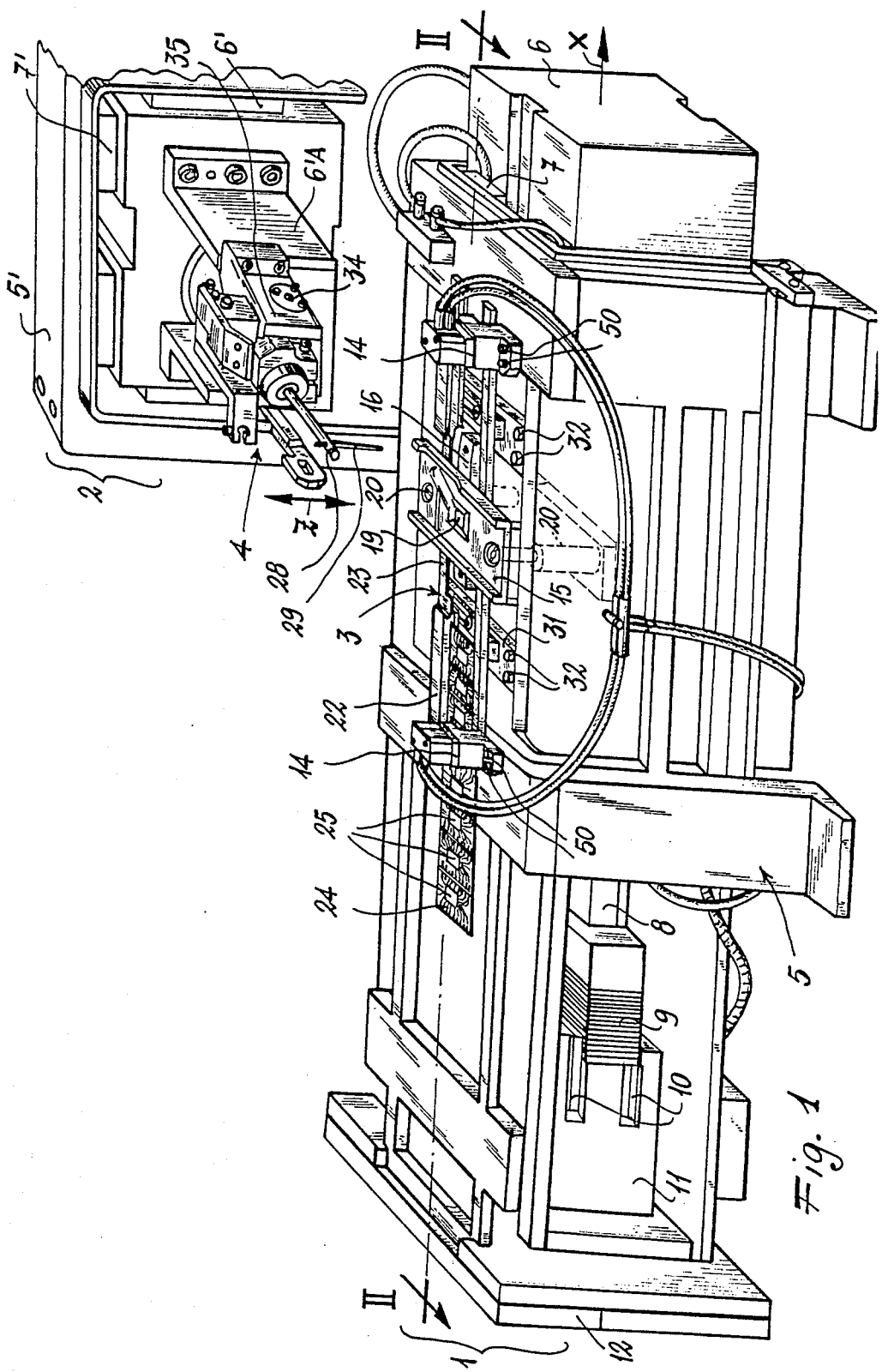
FIG. 1 is a perspective view of the device of the present invention applied to the aforesaid process.

With reference to the figures, the device comprises two separate components, indicated overall by numberals 1 and 2, which components have their axes mutually orthogonal and are positioned at different heights, the first component supporting a work table 3, and the second component 2 supporting an operating head 4. The component 1, which can be considered to be positioned along an X-axis, comprises an outer support housing 5 defining a tubular cavity of substantially square cross-section, and a mobile member 6 within the housing 5 and represented by a bar of triangular or square cross-section and preferably of polygonal perimeter. Said mobile member 6 is supported in the outer housing 5 on air cushions by three or four conventional pneumostatic shoes 7 delivering compressed air and disposed in a peripheral position about the member 6.

To one end 8 of the inner mobile member 6 there is fitted a rectangular coil 9 disposed in a magnetic field generated by a pair of permanent magnets 10 supported in a C-shaped iron structure 11 connected by a plate 12 to the outer housing 5, wherein said elements forming a known linear motor. The structure 11 has an intermediate core which penetrates into the coil 9. The coil and magnets can also be of cylindrical shape.

A position sensor 13 is disposed between the outer housing 5 and the inner member 6 and consists of a conventional encoder formed from a reading part 13A associated with the stationary outer housing 5, and an optical line 13B associated with the inner mobile member 6, said encoder enables the movement of the inner member 6 to be kept under control, said movement being effected by changing the power supply to the coil 9. Thus by using the same methods and same electronic equipment used to control direct current rotary motors and utilizing the signal derived from a position sensor, the inner member 6 can be moved in accordance with a predetermined program.

On the upper part of the inner mobile member 6 towards the end part of the coil 9 there is disposed the work table 3 comprising the elements for guiding the workpiece, elements for retaining the workpiece and elements required for the process to which the workpieces are to be subjected. Said elements comprise two or more grippers 14, a presser 15, a heating elements 16 and two lateral guides 23.

The grippers 14 are fixed directly onto the stationary outer housing 5 by bolts or other means 50 and comprise a pneumatic operating cylinder 14A and two jaws 17 and 18, of which the former is stationary and, as can be more clearly seen from FIGS. 3 and 4, provided on a support 14B of the cylinder 14A, and the latter 18 is mobile (in the direction of the arrow F of FIG. 3). Jaw 18 is also associated with the rod of the piston 14C provided in the operating cylinder 14A and moving along the gripper axis when urged pneumatically.

The presser 15, lying on a horizontal plane, has an aperture 19 and is mobile relative to the member 6 which supports it, this movement being vertical in the direction of the arrow G of FIG. 2. The movement in the direction of the arrow G is obtained by two pneumatic cylinders 20 mounted in the inner member 6 by means of a plate and screws 26 and 27. When said member 6 moves, the presser therefore moves in the same direction. The presser is supported by the rods of the pneumatic cylinders 20.

The heating element 16 is positioned below the presser 15 and is also supported by the rod of a pneumatic cylinder 20A, which is also fixed to the plate 26.

The work table 3 is fixed to the inner mobile member 6 by a plates 31 and bolts 32, it being inserted into the corridor 21 defined by the heating element 16 and presser 15 and comprises a structure 22 on which lateral guides 23 are defined for receiving the edges of a conventional metal strip 24 onto which the wires are to be bonded.

In known manner, the metal strip 24 comprises a succession of identical parts 30, each of which forms the conducting base of an electronic component (chip). This base comprises in its centre an island 25 on which a microcircuit has been previously attached. In the device of the invention, conducting wires are bonded between the microcircuit and the base-surrounding parts 33 which are to form the pins of the electronic component.

Finally, said lateral guides comprise apertures 28 through which the jaws 17 and 18 of the grippers 14 can pass to grip the metal strip 24 and retain it during the movement of the presser 24, heating element 16 and structure 22 of the work table 3 when, having completed one bonding operation on a base element of the metal strip, the machine moves into position to bond the wires onto the next.

The accompanying figures also show the operating air feed and return hoses for the said pneumatically driven devices.

With regard to the second component 2, its axis is orthogonal to that of the component 1 and can be defined as the Y-axis.

Said second component 2 comprises outer and inner structures similar to that of the component 1, namely a stationary outer support housing 5' defining a tubular cavity, and a pneumostatically supported mobile inner member 6' of polygonal perimeter driven axially in the same manner as the already described mobile inner member 6. The component 2 is positioned at a higher level than the component 1.

At that end 6'A of the mobile member 6' facing the component 1 there is a conventional operating head 4 comprising an ultrasonic transducer 28 carrying a capillary needle 29. The operating head can be constructed as described in U.S. Pat. No. 4,610,387. The operating head is however preferably simpler than that of the said patent in the sense of dispensing with those members indicated by 2, 3, 4 and 4' in said patent and used to displace the pivotal pin 6 vertically. This pivotal pin is indicated herein by numeral 34 and is supported at the ends of arms 35 which project from the mobile member 6'.

With reference to the case described heretofore the operation of the device of the present invention is as follows: the metal strip 24 to which the connection wires for the electronic components are to be bonded is placed on the work table 3 and made to slide within its guides 23 in the direction of the arrow X of FIGS. 2 and 3. When positioned between the presser 15 and heating element 16, these move in opportune manner in the direction of the arrow G of FIG. 2 to grip the metal strip 24 and clamp it. The operating head 4 is moved in the direction Y so that by rotating the capillary needle 29, the wire to be bonded is moved in the direction of the arrow Z of FIG. 1 and brought into contact with the required point of the metal strip 24. By controlled movement of the operating head 4 along the Y-axis, using with an encoder on head 4 analogous to the encoder 13, and by controlled movement of the strip along the X-axis and by controlled movement of the operating head 4 about the pivotal axis 34, the electronic component connection wires can be bonded onto the strip 24 in any orientation.

On completion of bonding the jaws 17 and 18 of the grippers are tightened, and these, by passing through the apertures 28 located in the guides 23, strip is clamped in the position assumed during the making of the preceding bonded joints. At this point the presser 15 is raised (in the direction of arrow G in FIG. 2) and the heating element 16 is lowered so that the strip 24 is no longer gripped between said elements.

In order to advance the strip through one step for operation on its next element 30, the inner mobile member 6 is moved through one step in the direction in which the strips 24 are inserted (direction of arrow W in FIG. 2). The presser 15, the heating element 16 and the structure 22 of the work table 3 consequently move associated with the inner member 6, but not the strip 24 as this is immobilized by the grippers 14.

Having completed this movement, the presser 15 and heating element 16 are closed together and the grippers 14 opened. The mobile member 16 is then moved through one step in the opposite direction to the preceding (ie in the direction of the arrow X of FIG. 2), with the result that the new element 30 requiring bonding is moved into the bonding region.

The exact position of the element 30 under the bonding capillary 29 is controlled by the position sensor 13 disposed between the outer housing 5 and the inner member 6, in a position opposite the heating element 16. This control combined with a motor control system for advancing the inner mobile member 6 enables said member to be moved in accordance with a determined program which takes account of the different dimensions of the workpieces.

The aforesaid movements, i.e. movement of the workpieces along an X-axis and movement of the operating head along a Y-axis, are repeated for every bonded unit, until the strip 24 is completed. The strip 24 is fed onto the work table 3 and expelled therefrom after completion of bonding by conventional systems such as air pistons or friction motors, not shown on the figures and not being part of the present invention. The described system dispenses with the strip feed mechanism. Said system can however also be implemented using conventional rotary motors with lead screws and mechanical guides, i.e. without using linear motors and pneumatic cushioning, provided the components 1 and 2, and thus the X and Y axes, remain separated and the grippers 14 remain fixed on the outer housing of the component carrying the workpiece.

What I claim is:

1. A device with movement along first and second orthogonal directions for positioning and processing workpieces, in particular for bonding wires onto electronic components, characterized in that on said orthogonal directions there are positioned two non-superposed components, the first of which is positioned along the first direction and comprises a workholding table, grippers fixed to a stationary housing of the first component and having a mobile element and a fixed element for clamping the workpiece, a presser in which an operating aperture is provided, and a heating element, said presser, heating element, grippers, and workholding table also forming a feed mechanism for the workpiece, the second component being positioned along the second direction and carrying an operating head for operating on said workpiece.

2. A device as claimed in claim 1, characterised in that the component positioned along the X-axis comprises the stationary outer housing and, internal thereto, stationary pneumostatic shoes, a mobile polygonal member supported on said shoes, the stator of a linear electric motor, and a winding of said linear electric motor rigid with said mobile polygonal member, said mobile polygonal member supporting the presser, the heating element and the workholding table, said workholding table being parallel to the axis of said mobile member.

3. A device as claimed in claim 1, characterised by comprising a linear encoder disposed along the X-axis on the inside of the outer stationary housing of the first component to determine the position of the mobile polygonal member relative to said outer stationary housing.

4. A device as claimed in claim 1, characterised in that the centre of the working position on the heating element lies in the same plane as the centre line through the mobile part of said position sensor said plane being orthogonal to the direction of movement of the inner mobile member.

5. A device as claimed in claim 1, characterised in that the second component is positioned along the Y-axis and comprises a stationary outer housing and, internal thereto, a mobile polygonal member supported on pneumostatic shoes and moved by a linear electric motor, and comprising an operating head at the end distant from that at which said linear electric motor is located.

6. A device as claimed in claim 5, characterised in that said operating head comprises a pivotally mounted ultrasonic transducer supporting a capillary needle.

7. A device for positioning and processing a workpiece, in particular for bonding wires onto electronic components, comprising a first component disposed for movement along a first direction with means for supporting and clamping the workpiece; and a second component disposed for movement along a second direction orthogonal to said first direction, said second component carrying an operating head for operating on said workpiece; and said operating head extending substantially in said second direction and having an operating means swingable in a plane which is perpendicular to said first direction.

8. A device as claimed in claim 7, wherein the first component comprises:
 (a) a stationary housing having a fixed element; a mobile element within said fixed element and disposed for movement along said first direction with respect to said fixed element; and a worktable disposed for movement with said mobile element;
 (b) at least one gripper fixed to said stationary housing, for clamping the workpiece;
 (c) a presser having an operating aperture, said presser being disposed for movement along a third direction relative to said mobile element for gripping the workpiece; and
 (d) another element lying on a horizontal plane positioned between said presser and said mobile element and disposed for movement along said third direction such that it cooperates with said presser for gripping the workpiece;
 (e) said worktable, gripper, presser, and another element in combination cooperate also to provide a means for feeding the workpiece.

9. A device as claimed in claim 8, said first component further comprises:
 (f) a plurality of stationary pneumostatic shoes fixed to said stationary housing for supporting said mobile element; and
 (g) a stator and a winding of an electric motor both connected to said mobile element and providing a linear motor for moving said mobile element along said first axis.

10. A device as claimed in claim 9, further comprising a linear encoder positioned along said first axis between the fixed element and said mobile element such that it cooperates with said linear motor to control the movement of said mobile element relative to said stationary housing.

11. A device as claimed in claim 10, wherein said encoder has a mobile part connected to said mobile element and a stationary part connected to an inner part of said fixed element.

12. A device as claimed in claim 11, wherein said another element is a heating element, wherein the center of the workpiece when positioned on the heating element lies in the same plane as the center line through the mobile part of said encoder, and said plane being orthogonal to said first direction of movement of the mobile element.

13. A device as claimed in claim 7, characterized in that the second component comprises a stationary housing having a fixed element, a mobile element; plurality of pneumostatic shoes for supporting said mobile element; and a linear electric motor positioned at one end of said mobile element for moving said mobile element;

and an operating head positioned at the other end of said mobile element.

14. A device as claimed in claim 13, wherein said operating head comprises a pivotally mounted ultrasonic transducer supporting a capillary needle.

15. A device for positioning and processing a workpiece, in particular for bonding wires onto electronic components, comprising:
   (a) a first component having means for supporting the workpiece, said component being disposed for movement along a first direction; and
   (b) a linear motor for moving said first component along said first direction during bonding operations and in a step-by-step fashion between bonding operations.

16. The device of claim 15, further including a frame and pneumostatic means for supporting said component on said frame.

17. The device of claim 16, further including a second component disposed for movement along a second direction orthogonal to said first direction, said second component carrying an operating head arranged for movement in said second direction and having operating merans swingable in a plane which is perpendicular to said first direction.

* * * * *